(12) United States Patent
Kim

(10) Patent No.: US 10,784,372 B2
(45) Date of Patent: Sep. 22, 2020

(54) SEMICONDUCTOR DEVICE WITH HIGH VOLTAGE FIELD EFFECT TRANSISTOR AND JUNCTION FIELD EFFECT TRANSISTOR

(71) Applicant: Magnachip Semiconductor, Ltd., Cheongju-si (KR)

(72) Inventor: Young Bae Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 63 days.

(21) Appl. No.: 16/123,253

(22) Filed: Sep. 6, 2018

(65) Prior Publication Data

US 2019/0013403 A1 Jan. 10, 2019

Related U.S. Application Data

(63) Continuation-in-part of application No. 15/915,105, filed on Mar. 8, 2018, now Pat. No. 10,096,707.
(Continued)

(30) Foreign Application Priority Data

Apr. 3, 2015 (KR) .......................... 10-2015-0047731
Apr. 9, 2018 (KR) .......................... 10-2018-0041261

(51) Int. Cl.
*H01L 29/78* (2006.01)
*H01L 29/06* (2006.01)
(Continued)

(52) U.S. Cl.
CPC ........ *H01L 29/7832* (2013.01); *H01L 27/085* (2013.01); *H01L 29/063* (2013.01);
(Continued)

(58) Field of Classification Search
CPC ............ H01L 29/7832; H01L 29/0653; H01L 29/41758; H01L 29/402–404;
(Continued)

(56) References Cited

U.S. PATENT DOCUMENTS 4,143,392 A * 3/1979 Mylroie .............. H01L 27/0716
257/273
4,941,027 A * 7/1990 Beasom .............. H01L 29/7816
257/402
(Continued)

FOREIGN PATENT DOCUMENTS

JP 2013-509731 A 8/2014
WO WO 2011/053932 A1 3/2013

OTHER PUBLICATIONS

Korean Office Action dated Dec. 19, 2018 in counterpart Korean Patent Application No. 10-2015-0047731 (7 pages in Korean).

*Primary Examiner* — Maliheh Malek
(74) *Attorney, Agent, or Firm* — NSIP Law

(57) ABSTRACT

Described is a semiconductor device including a first N-type well region disposed in a substrate and a second N-type well region in contact with the first N-type well region, a source region disposed in the first N-type well region, a drain region disposed in the second N-type well region, and a first gate electrode and a second gate electrode disposed spaced apart from the drain region. A maximum vertical length of the source region in a direction vertical to the first or second gate electrode is greater than a maximum vertical length of the drain region in the direction in a plan view.

20 Claims, 10 Drawing Sheets

Related U.S. Application Data which is a continuation of application No. 14/942,527, filed on Nov. 16, 2015, now Pat. No. 9,947,786.

(51) Int. Cl.

| | | |
|---|---|---|
| *H01L 29/80* | (2006.01) | |
| *H01L 27/085* | (2006.01) | |
| *H01L 29/808* | (2006.01) | |
| *H01L 29/10* | (2006.01) | |
| *H01L 29/417* | (2006.01) | |
| *H01L 29/66* | (2006.01) | |
| *H01L 29/40* | (2006.01) | |
| *H02M 7/00* | (2006.01) | |
| *H01L 29/423* | (2006.01) | |

(52) U.S. Cl.
CPC ...... *H01L 29/0649* (2013.01); *H01L 29/0688* (2013.01); *H01L 29/0696* (2013.01); *H01L 29/1058* (2013.01); *H01L 29/1066* (2013.01); *H01L 29/402* (2013.01); *H01L 29/41758* (2013.01); *H01L 29/66659* (2013.01); *H01L 29/66901* (2013.01); *H01L 29/7835* (2013.01); *H01L 29/808* (2013.01); *H02M 7/00* (2013.01); *H01L 29/1045* (2013.01); *H01L 29/42368* (2013.01)

(58) Field of Classification Search
CPC ........... H01L 29/66893; H01L 29/0688; H01L 29/1066; H01L 29/808–8086; H01L 2924/13062; H01L 27/14679
See application file for complete search history.

(56) References Cited

U.S. PATENT DOCUMENTS

| | | | | |
|---|---|---|---|---|
| 5,191,401 A * | 3/1993 | Shirai | ................ | H01L 27/0922 257/328 |
| 5,306,944 A | 4/1994 | Beasom | | |
| 5,523,599 A * | 6/1996 | Fujishima | .......... | H01L 29/0615 257/327 |
| 6,011,283 A * | 1/2000 | Lee | ..................... | H01L 27/0623 257/205 |
| 6,020,607 A * | 2/2000 | Nagai | ................ | H01L 29/1066 257/266 |
| 6,091,793 A * | 7/2000 | Kamashita | ........... | G11C 19/282 257/258 |
| 6,118,141 A * | 9/2000 | Xu | ..................... | H01L 29/7436 257/133 |
| 6,168,983 B1 | 1/2001 | Rumennik et al. | | |
| 6,207,994 B1 * | 3/2001 | Rumennik | ................ | H01L 21/26 257/339 |
| 6,433,374 B1 * | 8/2002 | Fukunaga | ......... | H01L 27/14609 257/291 |
| 6,570,219 B1 * | 5/2003 | Rumennik | ............ | H01L 21/26 257/262 |
| 6,600,206 B2 | 7/2003 | Jeon et al. | | |
| 6,825,700 B2 | 11/2004 | Hano | | |
| 6,867,100 B2 * | 3/2005 | Edwards | ............. | H01L 29/0696 257/E29.027 |
| 6,903,421 B1 * | 6/2005 | Huang | ................ | H01L 29/0634 257/335 |
| 6,995,428 B2 * | 2/2006 | Huang | ................ | H01L 29/0634 257/213 |
| 7,002,398 B2 | 2/2006 | Disney | | |
| 7,064,407 B1 * | 6/2006 | Mallikarjunaswamy | .................... | H01L 27/0727 257/287 |
| 7,173,308 B2 * | 2/2007 | Kitaguchi | ....... | H01L 21/823857 257/335 |
| 7,205,824 B2 | 4/2007 | Disney | | |
| 7,323,747 B2 * | 1/2008 | Ikuta | .................. | H01L 29/0696 257/288 |
| 7,491,611 B2 | 2/2009 | Disney | | |
| 7,560,808 B2 * | 7/2009 | Korec | ................ | H01L 29/7816 257/691 |
| 7,605,428 B2 * | 10/2009 | Williams | ............. | H01L 21/761 257/335 |
| 7,629,645 B2 * | 12/2009 | Montanini | .......... | H01L 21/2652 257/330 |
| 7,812,402 B2 * | 10/2010 | Hatade | ........... | H01L 21/823814 257/168 |
| 7,851,314 B2 * | 12/2010 | Mallikarjunaswamy | .................... | H01L 21/26513 438/286 |
| 8,129,815 B2 | 3/2012 | Banerjee et al. | | |
| 8,217,487 B2 | 7/2012 | Choi et al. | | |
| 8,236,656 B2 | 8/2012 | Disney | | |
| 8,575,531 B2 * | 11/2013 | Hynecek | ............. | H01L 27/1464 250/208.1 |
| 8,674,440 B2 * | 3/2014 | Korec | ................ | H01L 21/8234 257/341 |
| 8,786,016 B2 * | 7/2014 | Jang | .................... | H01L 29/7816 257/343 |
| 8,866,201 B2 | 10/2014 | Banerjee et al. | | |
| 8,957,475 B2 * | 2/2015 | Moon | ............... | H01L 29/66681 257/335 |
| 9,024,381 B2 * | 5/2015 | Cho | .................. | H01L 29/66712 257/341 |
| 9,184,304 B2 * | 11/2015 | Kim | ........... | H01L 29/808 |
| 9,190,536 B1 * | 11/2015 | Chan | .................. | H01L 29/1058 |
| 9,214,457 B2 * | 12/2015 | Tsuchiko | ............ | H01L 21/8222 |
| 9,245,997 B2 * | 1/2016 | Hebert | ............... | H01L 29/7816 |
| 9,358,186 B2 | 6/2016 | Chandra et al. | | |
| 9,385,186 B2 * | 7/2016 | Li | ...................... | H01L 29/7832 |
| 9,401,401 B2 * | 7/2016 | Hebert | ............... | H01L 29/7816 |
| 9,431,481 B2 * | 8/2016 | Lee | .................... | H01L 29/74 |
| 9,460,926 B2 * | 10/2016 | Mallikarjunaswamy | .................... | H01L 29/7823 |
| 9,520,492 B2 * | 12/2016 | Chan | ................ | H01L 29/7816 |
| 9,548,203 B2 * | 1/2017 | Kim | .................. | H01L 29/1095 |
| 9,673,323 B2 * | 6/2017 | Yeh | .................... | H01L 29/404 |
| 9,837,400 B2 * | 12/2017 | Mallikarjunaswamy | .................... | H01L 29/7823 |
| 9,947,786 B2 * | 4/2018 | Kim | .................. | H01L 29/402 |
| 10,014,408 B1 * | 7/2018 | Lin | .................. | H01L 29/66681 |
| 2002/0050613 A1 * | 5/2002 | Rumennik | .......... | H01L 29/0619 257/325 |
| 2002/0113653 A1 * | 8/2002 | Emmerik | ................ | G05F 3/242 330/277 |
| 2004/0178443 A1 * | 9/2004 | Hossain | .............. | H01L 29/7835 257/328 |
| 2004/0251497 A1 * | 12/2004 | Williams | ............. | H01L 21/2658 257/338 |
| 2005/0184338 A1 * | 8/2005 | Huang | ................ | H01L 29/0634 257/335 |
| 2005/0253201 A1 * | 11/2005 | Inoue | ............. | H01L 21/823892 257/386 |
| 2006/0071247 A1 * | 4/2006 | Chen | ..................... | H01L 29/808 257/272 |
| 2007/0158681 A1 * | 7/2007 | Kim | .................. | H01L 27/088 257/173 |
| 2007/0221963 A1 * | 9/2007 | Saito | .................... | H01L 27/098 257/256 |
| 2007/0278568 A1 * | 12/2007 | Williams | ............. | H01L 21/761 257/335 |
| 2008/0035987 A1 * | 2/2008 | Hebert | ............. | H01L 21/26586 257/330 |
| 2008/0237656 A1 * | 10/2008 | Williams | ................ | H01L 29/735 257/262 |
| 2008/0237704 A1 * | 10/2008 | Williams | ............. | H01L 21/761 257/338 |
| 2009/0111252 A1 * | 4/2009 | Huang | ................ | H01L 21/2253 438/530 |
| 2009/0261409 A1 * | 10/2009 | Tsai | .................... | H01L 29/0878 257/339 |
| 2010/0032731 A1 * | 2/2010 | Babcock | ............ | H01L 27/095 257/280 |

(56) References Cited

U.S. PATENT DOCUMENTS

| | | | |
|---|---|---|---|
| 2010/0148254 A1* | 6/2010 | Park | H01L 21/823462 257/337 |
| 2010/0301412 A1* | 12/2010 | Parthasarathy | H01L 27/0629 257/337 |
| 2011/0074498 A1* | 3/2011 | Thompson | H01L 21/823412 327/543 |
| 2011/0080213 A1* | 4/2011 | Tang | H01L 27/085 327/581 |
| 2011/0101454 A1* | 5/2011 | Ichijo | H01L 29/063 257/339 |
| 2011/0156052 A1* | 6/2011 | Malhan | H01L 29/1066 257/77 |
| 2011/0156682 A1* | 6/2011 | Girdhar | H01L 27/0629 323/283 |
| 2011/0227095 A1* | 9/2011 | Treu | H01L 23/49575 257/77 |
| 2011/0241083 A1* | 10/2011 | Khemka | H01L 27/0705 257/262 |
| 2012/0032272 A1* | 2/2012 | Yoshida | H01L 21/823475 257/369 |
| 2012/0043608 A1* | 2/2012 | Yang | H01L 29/0653 257/336 |
| 2012/0104468 A1* | 5/2012 | Li | H01L 29/0634 257/285 |
| 2012/0112277 A1* | 5/2012 | Denison | H01L 21/823814 257/337 |
| 2012/0119331 A1* | 5/2012 | Gendron | H01L 29/87 257/587 |
| 2012/0187458 A1* | 7/2012 | Knaipp | H01L 29/0692 257/256 |
| 2012/0273879 A1* | 11/2012 | Mallikarjunaswamy | H01L 29/4175 257/335 |
| 2012/0299096 A1* | 11/2012 | Huo | H01L 29/0607 257/343 |
| 2013/0009253 A1* | 1/2013 | Wang | H01L 27/0629 257/379 |
| 2013/0069712 A1* | 3/2013 | Trajkovic | H01L 29/7393 327/537 |
| 2013/0240898 A1* | 9/2013 | Briere | H01L 27/04 257/76 |
| 2013/0294172 A1* | 11/2013 | Park | H01L 29/66825 365/185.28 |
| 2013/0313617 A1* | 11/2013 | Yeh | H01L 29/404 257/256 |
| 2013/0341718 A1* | 12/2013 | Kim | H01L 29/402 257/342 |
| 2014/0035047 A1* | 2/2014 | Korec | H01L 27/0629 257/368 |
| 2014/0054642 A1* | 2/2014 | Edwards | H01L 27/0262 257/124 |
| 2014/0061731 A1* | 3/2014 | Chen | H01L 29/872 257/272 |
| 2014/0104888 A1 | 4/2014 | Banerjee | |
| 2014/0191281 A1* | 7/2014 | Yamaji | H01L 27/088 257/139 |
| 2014/0197466 A1* | 7/2014 | Chan | H01L 27/0705 257/262 |
| 2014/0197467 A1* | 7/2014 | Hsu | H01L 21/76 257/272 |
| 2014/0211346 A1* | 7/2014 | Gendron | H02H 9/046 361/56 |
| 2014/0231884 A1* | 8/2014 | Yeh | H01L 29/404 257/285 |
| 2014/0246762 A1* | 9/2014 | Kwon | H01L 21/266 257/653 |
| 2014/0367771 A1* | 12/2014 | Chatty | H01L 29/7813 257/329 |
| 2015/0041892 A1* | 2/2015 | Hebert | H01L 29/0886 257/339 |
| 2015/0041894 A1* | 2/2015 | Hebert | H01L 29/7816 257/339 |
| 2015/0054038 A1* | 2/2015 | Masliah | H03F 1/0266 257/262 |
| 2015/0076600 A1* | 3/2015 | Jun | H01L 21/265 257/339 |
| 2015/0129977 A1* | 5/2015 | Chen | H01L 27/0277 257/390 |
| 2015/0137192 A1* | 5/2015 | Han | H01L 29/402 257/285 |
| 2015/0200295 A1* | 7/2015 | Prabhakar | H01L 29/7835 257/344 |
| 2015/0200309 A1* | 7/2015 | Karino | H01L 27/0248 257/272 |
| 2015/0295054 A1* | 10/2015 | Briere | H01L 29/778 257/192 |
| 2015/0311280 A1* | 10/2015 | Li | H01L 29/7832 363/49 |
| 2015/0325694 A1* | 11/2015 | Chan | H03K 17/687 327/434 |
| 2015/0333158 A1* | 11/2015 | Tsuchiko | H01L 21/76264 438/188 |
| 2015/0380398 A1* | 12/2015 | Mallikarjunaswamy | H01L 29/7823 257/272 |
| 2016/0118378 A1* | 4/2016 | Wu | H01L 29/402 327/534 |
| 2016/0133701 A1* | 5/2016 | O hAnnaidh | H01L 29/42376 257/401 |
| 2016/0141369 A1* | 5/2016 | Kim | H01L 29/1095 257/655 |
| 2016/0141418 A1* | 5/2016 | Yeh | H01L 29/404 257/262 |
| 2016/0240526 A1* | 8/2016 | Titus | H01L 29/7832 |
| 2016/0240615 A1* | 8/2016 | Tutuc | H01L 29/66681 |
| 2016/0276339 A1* | 9/2016 | Titus | H01L 27/0705 |
| 2016/0293758 A1* | 10/2016 | Kim | H01L 29/402 |
| 2017/0084496 A1* | 3/2017 | Kim | H01L 21/26513 |
| 2017/0133505 A1* | 5/2017 | Han | H01L 29/66681 |
| 2017/0301668 A1* | 10/2017 | Kim | H01L 27/088 |
| 2018/0026639 A1* | 1/2018 | Aurola | H03K 19/094 326/81 |
| 2018/0350978 A1* | 12/2018 | Kim | H01L 23/522 |
| 2020/0043801 A1* | 2/2020 | Kim | H01L 21/2253 |

* cited by examiner (a)

(b)

(a)

(b)

(a)

(b)

SEMICONDUCTOR DEVICE WITH HIGH VOLTAGE FIELD EFFECT TRANSISTOR AND JUNCTION FIELD EFFECT TRANSISTOR

CROSS-REFERENCE TO RELATED APPLICATIONS

This application is a continuation-in-part of U.S. application Ser. No. 15/915,105 filed on Mar. 8, 2018, which is a continuation of U.S. application Ser. No. 14/942,527 filed on Nov. 16, 2015, which claims the benefit under 35 U.S.C. 119(a) of Korean Patent Application No. 10-2015-0047731 filed on Apr. 3, 2015 in the Korean Intellectual Property Office, and further claims the benefit under 35 U.S.C. 119(a) of Korean Patent Application No. 10-2018-0041261 filed on Apr. 9, 2018, the entire disclosures of each of which are incorporated herein by reference for all purposes.

BACKGROUND

1. Field

The following description relates to a semiconductor device including a high voltage field effect transistor (HVFET) having a common drain structure and a junction field effect transistor (JFET). In addition, the following description also relates to a semiconductor device including a JFET configured to control a pinch-off voltage and current in a HVFET.

2. Description of Related Art

A high voltage field effect transistor (HVFET) is a device controlling passage of power having tens to hundreds of voltages associated with the power and performs switching of such a high voltage power. The HVFET has to have a high voltage endurance so that a breakdown does not occur even at a high voltage in order to block a current in a turned-off status and also have a small on-resistance value to reduce power loss in a turned-on status.

A junction field effect transistor (JFET) is a device included in such a controller of a high voltage power with the HVFET, and a circuit that controls a gate of the HVFET includes low voltage transistors; thereby, the JFET restricts a voltage and a current that are applied to the circuit so that they are not able to exceed a threshold through a pinch-off.

HVFETs and JFETs in related arts use a substantial area to perform the aforementioned features. Accordingly, the HVFETs and JFETs have difficulties in minimization of size.

To solve the above-described problem, the related arts disclose a fabricating method of a high voltage transistor and a high voltage transistor combined with a junction transistor. However, the junction transistor according to the technique above uses a well region used in a drift drain region of a high voltage transistor as a channel region of the junction field effect transistor. A doping concentration of the well region is determined depending on an on-resistance property of the high voltage transistor, and a structure of a buried impurity layer is determined. Therefore, there is an issue that respective control of current-voltage of the junction transistor is difficult.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The following description relates to a semiconductor device and manufacture method thereof with a junction transistor and a high voltage transistor feature that improves a degree of integration by minimizing an area.

Further, the following description relates to a semiconductor device and manufacture method with a junction transistor that may control a pinch-off feature of a junction transistor while maintaining an on-resistance (Rsp) feature of a high voltage transistor.

In one general aspect, a semiconductor device includes a first N-type well region disposed in a substrate and a second N-type well region in contact with the first N-type well region; a source region disposed in the first N-type well region, a drain region disposed in the second N-type well region; and a first gate electrode and a second gate electrode disposed spaced apart from the drain region, wherein a maximum vertical length of the source region in a direction vertical to the first or second gate electrode is greater than a maximum vertical length of the drain region in the direction in a plan view.

The source region and the drain region may be disposed between the first gate electrode and the second gate electrode.

The first N-type well region and the source region may comprise a junction field effect transistor (JFET), and the JFET has a rectangular shape in a plan view.

The rectangular shape may have a vertical length in a vertical direction greater than a horizontal length in a horizontal direction in the plan view.

The first N-type well region may have a cross-sectional area smaller than a cross-sectional area of the second N-type well region.

The first N-type well region may have a maximum depth smaller than or equal to a maximum depth of the second N-type well region with respect to a top surface of the substrate respectively.

The semiconductor device may further comprise a P-type gate region disposed in the first N-type well region.

The drain region, the first gate electrode and the second gate electrode of the semiconductor device may comprise a High Voltage Field Effect Transistor (HVFET).

In another general aspect, a semiconductor device includes a first gate electrode disposed on a substrate; a second gate electrode disposed on the substrate; and a first source region and a first drain region disposed between the first gate electrode and the second gate electrode, wherein the first source region has a maximum vertical length in a direction vertical to the first or second gate electrode and a maximum width in the direction, and wherein the maximum vertical length of the first source region is greater than the maximum width.

The semiconductor device may further comprise a well region, and the source region and the drain region are disposed in the well region.

The semiconductor device may further comprise a third gate electrode disposed on the substrate, and a second source region and a second drain region disposed between the second gate electrode and the third gate electrode.

The first and second source regions may comprise a junction field effect transistor (JFET), and wherein the first, second and third gate electrodes and the first and second drain regions comprise a High Voltage Field Effect Transistor (HVFET).

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
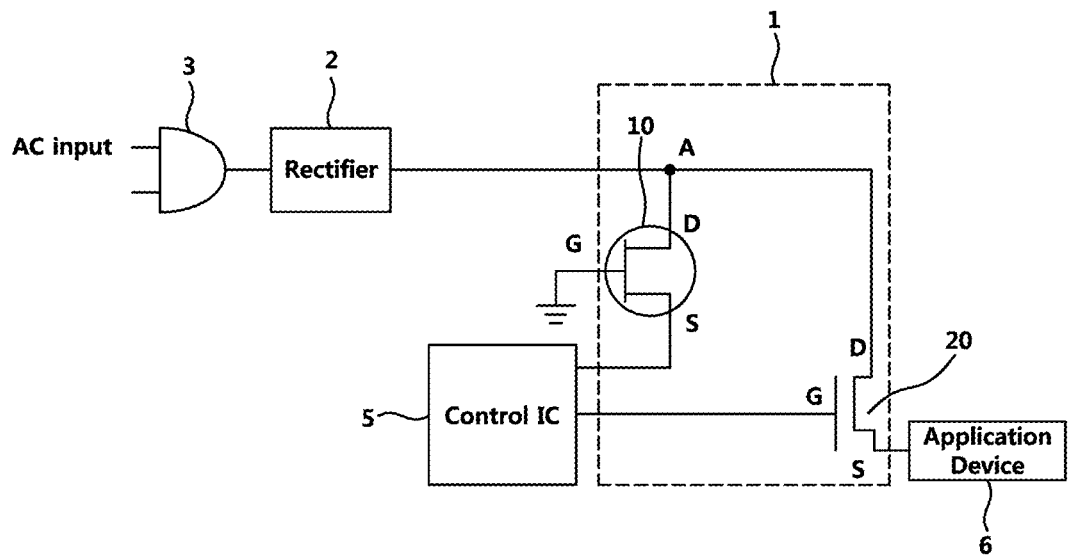
FIG. 1 is a block diagram illustrating a semiconductor device according to embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

For convenience of explanation, in a top-view of a semiconductor device, a part in which an external electrode D is disposed is referred to as a head, and a part in which a common drain region connected to an external electrode D is divided into two parts and is arranged long is referred to as a tail. However, it will be clearly understood that embodiments of the following disclosure are not limited to the above-mentioned names, but may be variously named, which will be apparent to those skilled in the art.

In addition, in the following description, if a substrate of a semiconductor device is P-type, a well region may be N-type in an embodiment. If a substrate of a semiconductor is N-type, a well region may be P-type in another embodiment.

The following description is provided to suggest a semiconductor device having the structure of a Junction Field Effect Transistor (JFET) and a High Voltage Field Effect Transistor (HVFET) that minimize an area, thereby improving integration degree.

The following description is also provided to suggest a semiconductor device having a JFET that may control pinch-off feature of a JFET while maintaining on-resistance feature of a HVFET.

The following description is also provided to suggest a semiconductor device having a JFET that may control a current amount while maintaining on-resistance feature of the JFET.

The following description is also provided to suggest a semiconductor device that allows electric field of a HVFET to be distributed uniformly without being affected by addition of a JFET.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram illustrating a semiconductor device according to embodiments.

According to FIG. 1, in order to implement a Junction Field Effect Transistor (JFET) 10 and a High Voltage Field Effect Transistor (HVFET) 20. Here, the JFET 10 is also referred to as Tap-JFET. The semiconductor device 1 converts an alternating current (AC) input 3 into a direct current (DC) voltage signal in a high voltage at a rectifier 2 and receives it. In the HVFET 20, an application device 6 is connected to an end of a source S, and a control IC 5 is connected to an end of a gate G. The application device 6 to which the semiconductor device 1 is connected may be a USB type C in an embodiment and may be a LED lighting driver in another embodiment, but embodiments of the present description are not limited thereto and include various devices using a HVFET and a JFET together. JFET 10 and HV NMOS 20 are integrated as one chip 1. The one chip (semiconductor device) 1 may use one common drain to integrate the JFET 10 and HV NMOS 20. The entire chip area is reducing by embedding the JFET 10 in a certain region of the HVFET 20.

Figure 2:
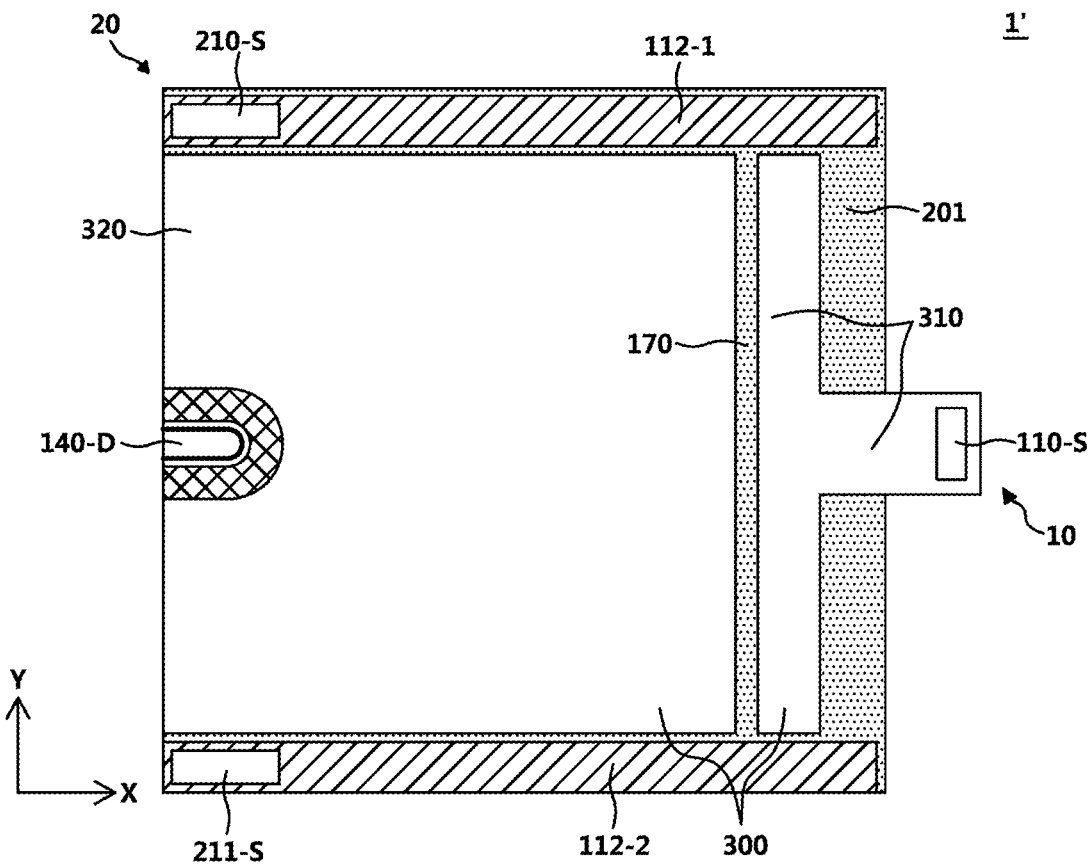
FIG. 2 is a top-view of a semiconductor device according to a comparative example.

FIG. 2 is a plan view of a semiconductor device according to a comparative example.

Referring to FIG. 2, a semiconductor device 1' includes a HVFET 20 and a JFET 10.

The JFET 10 includes an N-type source region (first N+ doped region) 110-S, an N-type drain region 140-D (second N+ doped region), and a P-type gate region 170, and the JFET 10 includes the first N-type well region 310.

The HVFET 20 includes an N-type drain region (second N+ doped region) 140-D formed in a substrate 201, an N-type HVFET source regions 210-S, 211-S (third N+ doped regions), a second N-type well region 320 and a P-type well region 112-1, 112-2. The HVFET 20 shares a drain region 140-D with the JFET 10. Thus, the drain region 140-D becomes a common drain region for JFET 10 and HVFET 20.

In the semiconductor device 1' of the comparative example, the source region 110-S and the first N-type well region 310 of the JFET 10 are extended outwardly to the boundary of the area of the HVFET 20, such that T-shaped JFET 10 is formed in the semiconductor device 1' in a plan view. T-shaped JFET 10 has an extra area of the first N-type well region 310. Due to the extra area of the first N-type well region 310. The amount of the N-type impurities (dopants) in the semiconductor device 1' may increase. N-type impurities (dopants) and P-type impurities (dopants) in the semiconductor device 1' are unbalanced. That is, an electrical field in the semiconductor device 1' of the comparative example is not uniformly distributed. The electric field may be locally concentrated on a certain portion of the semiconductor device 1', due to the increased amount of the N-type impurities. As a result, a breakdown voltage may be decreased in the semiconductor device 1' (see "Old" in FIG. 12).

Figure 3:
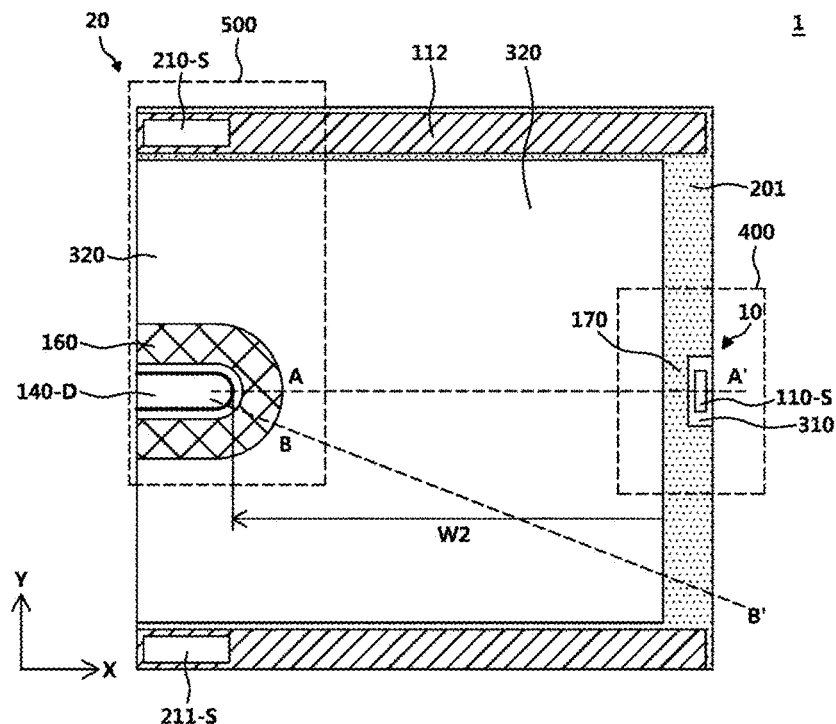
FIG. 3 is a top-view of an embodiment of a semiconductor device.

FIG. 3 is a plan view of an embodiment of a semiconductor device. An N-type well region 300 includes the N-type well region 310 and the N-type well region 320. For convenience of the description, hereinafter the N-type well region 310 of the JFET 10 is referred to as a first N-type well region 310, and the N-type well region 320 of the HVFET 20 is referred to as a second N-type well region 320. The area of the first N-type well region 310 is remarkably smaller than an area of the second N-type well region 320. The small area of the first N-type well region 310 is intended to minimize the increase of total N-type dopants.

Referring to FIG. 3, in a plan view (top view), the first N-type well region 310 of the JFET 10 of the semiconductor device 1 has a rectangular shape. Thus, an area of the first N-type well region 310 of the JFET 10 in FIG. 3 is smaller than an area of the first N-type well region 310 of the JFET 10 in FIG. 2. The JFET 10 is embedded in the HVFET 20. That is, the JFET 10 is not formed to be protrusive outwardly from a border of the HVFET 20. Thus, an overall shape of the HVFET 20 combined with the JFET 10 is a rectangle.

Due to the small area of the first N-type well region 310, the amount of the N-type impurities is not increased much, compared to the comparative example illustrated in FIG. 2. N-type impurities and P-type impurities in the semiconductor device 1 are balanced. Therefore, the semiconductor device 1 according to the embodiment may allow a breakdown voltage in a predetermined range (see "New" in FIG. 12) and also minimize the chip size.

The semiconductor device 1 includes a JFET 10 in the first area 400 and a HVFET 20 in the second area 500. All of the N-type well regions 310 and 320 are formed in a substrate 201. The source region 110-S of the JFET 10 is an N+ doped region formed in the first N-type well region 310. A vertical length of the source region 110-S of the JFET 10 is greater than a vertical length of the drain region 140-D of HVFET 20 in a Y-direction in a plan view. A P-type gate region 170 of the JFET 10 is formed between the first N-type well region 310 and the second N-type well region 320. The P-type gate region 170 is formed in the substrate 201.

The HVFET 20 includes a common drain region 140-D (a second N+ doped region), a HVFET source region 210-S, 211-S, and a gate electrode 221-G, as illustrated in the second area 500. A maximum vertical length of the source region 110-S of the JFET 10 is greater than a maximum vertical length of the drain region 140-D of HVFET 20 in a Y-direction in a plan view.

In addition, the HVFET 20 includes a P-type well region 112. The channel region and HVFET source region 210-S of the HVFET 20 are formed in the P-type well region 112.

The HVFET 20 may further include a field plate 160. The field plate 160 may comprise metal or polycrystalline silicon to reduce the electric field on the semiconductor device 1, thereby increasing a breakdown voltage of the semiconductor device 1.

Figure 4:
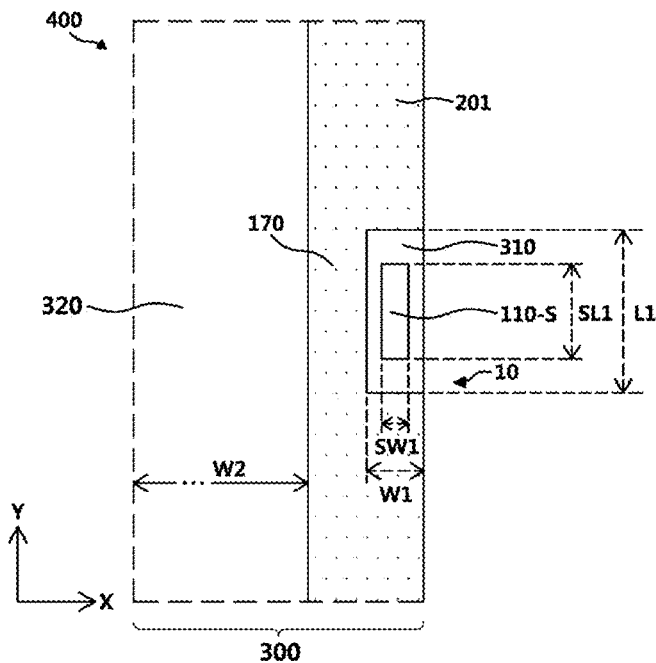
FIG. 4 is a diagram in which a portion of the semiconductor device of FIG. 3 is enlarged.

FIG. 4 is a diagram in which the region 400 of FIG. 3 illustrating an embodiment of the present description is enlarged. Referring to FIG. 4, the N-type well region 300 includes, in a direction parallel to a surface of a substrate 201, the first N-type well region 310 having a first width w1 and a second N-type well region 320 having a second width w2. The first N-type well region 310 includes a source region 110-S (a first N+ doped region) of a JFET 10 so that the source region of JFET 10 and the first N-type well region 310 can be formed to shape a rectangular. The source region 110-S of the JFET 10 has a vertical length SL1 greater than a horizontal length (width) SW1 in a plan view. The current of the JFET depends on the vertical length SL1 of the source region 110-S as well as the width SW1 of the source region 110-S. If the vertical length SL1 of the source region 110-S increases, the current of the JFET 10 increases. The first N-type well region 310 of the JFET 10 also has a vertical length L1 greater than a horizontal length (width, W1) in a plan view.

Figure 5:
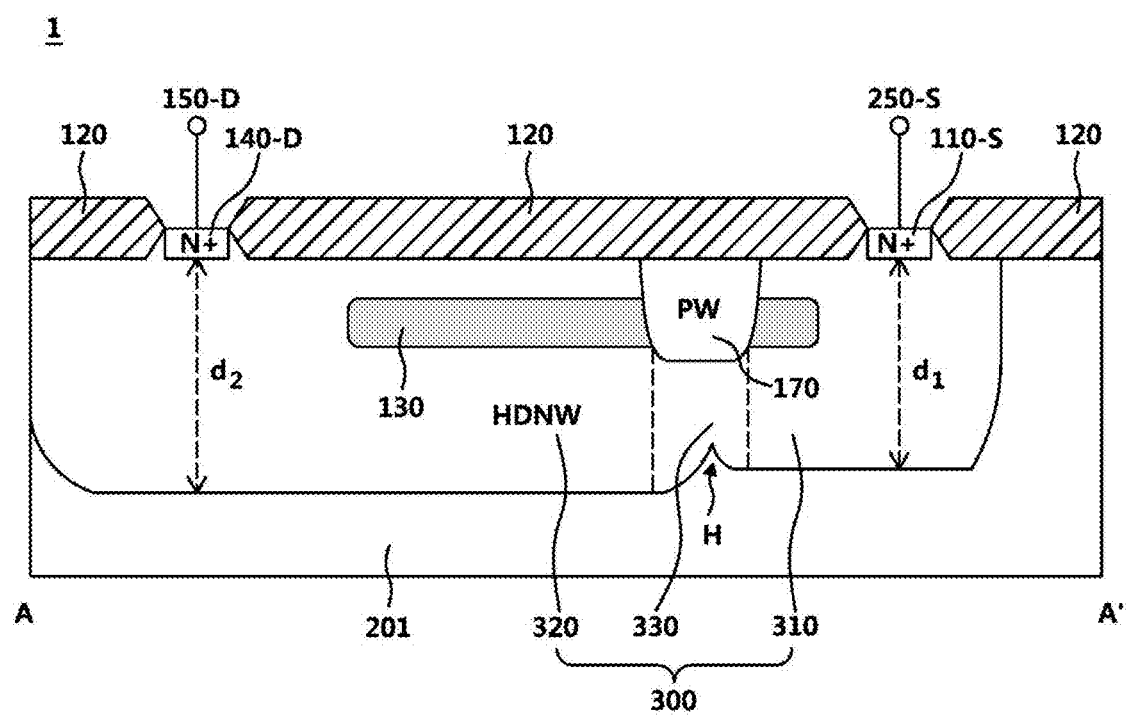
FIG. 5 is a cross-sectional view taken along the line A-A' of the semiconductor device 1 of FIG. 3.

FIG. 5 is a cross-sectional view of an embodiment of a semiconductor, which is the cross-sectional view taken along line A-A' of the semiconductor device 1 of FIG. 3.

Referring to FIG. 5, in the semiconductor device 1, a well region 300 is formed in a substrate 201. In an embodiment, if the substrate has a P-type conductivity, the well region may have an N-type conductivity. In another embodiment, if the substrate has an N-type conductivity, the well region may have a P-type conductivity. The first N-type well region 310 of a JFET 10 is disposed in the substrate 201 and has a first depth d1. A first N+ doped region 110-S is disposed in the first N-type well region 310.

The semiconductor device 1 further includes a second N+ doped region 140-D in an N-type well region 300. The first N+ doped region 110-S and the second N+ doped region 140-D are disposed spaced apart from each other on a top surface of the substrate. The first N+ doped region is a source region of the JFET, and the second N+ doped region is a drain region of the JFET.

The N-type well region 300 includes the first N-type well region 310 having a first depth d1 from a top surface of the substrate 201 and a second N-type well region 320 having a second depth d2 from the top surface of the substrate 201. According to various embodiments, the first depth d1 and the second depth d2 may be equal (that is, d1=d2), or the first depth d1 may be smaller than the second depth d2 as illustrated in FIG. 5 (that is, d1<d2).

The semiconductor device 1 includes a P-type gate region 170 that is disposed in the N-type well region 300 and has a third depth smaller than the respective first and second depths. The P-type gate region 170 is disposed closer to the source region 110-S than the drain region 140-D. The P-type gate region 170 may be maintained at a ground voltage in an embodiment, but may be maintained at a different voltage in another embodiment.

The semiconductor device 1 may further include a P+ doped region (not illustrated) in the P-type gate region 170 in an embodiment. To the P+ doped region, a ground voltage may be applied via a terminal (not illustrated) according to an embodiment, and a different voltage may be applied according to another embodiment.

A drain region of a HVFET 20 and a JFET 10, that is, the second N+ doped region 140-D is formed in the second N-type well region 320, and the drain region 140-D is formed as N-type and is connected to the common drain terminal 150-D. The common drain terminal 150-D is made of a metal wire.

The semiconductor device 1 may further include a field plate 160 on a surface of a field oxide film 120 disposed closer to the drain region 140-D than the source region 110-S. The field plate 160 is connected to a common drain region.

The source region 110-S of the JFET 10 is formed in the first N-type well region 310, and the source region 110-S is formed as N-type and is connected to the source terminal 250-S of the JFET 10. The source terminal 250-S is made of a metal wire.

The JFET source region and the first N-type well region 310 are formed in a boundary of the HVFET 20, but is not extended into outside the HVFET 20, as illustrated in FIG. 3. The first N-type well region 310 and the second N-type well region 320 each are initially formed spaced apart by a certain distance, and subsequently, they meet at a certain point H after going through a heat treatment at a high temperature. The second N-type well region 320 and the first N-type well region 310 are formed by ion implantation at an equal impurity concentration, and a diffusion region 330 is formed by diffusion of ion-implanted N-type dopants.

The diffusion region 330 includes a concave groove H. An N-type impurity concentration of the diffusion region 330 may be lower than that of the first N-type well region 310 or the second N-type well region 320. A depth of a bottom surface of the diffusion region 330 may be lower than or equal to that of the first N-type well region 310 or the second N-type well region 320.

According to embodiments, a maximum depth d1 of the first N-type well region 310 may be equal to or different from a maximum depth d2 of the second N-type well region 320.

In an embodiment, depending on an area of the source region 110-S of the JFET, the maximum depth d1 of the first N-type well region 310 may be smaller than the maximum depth d2 of the second N-type well region 320 (d1<d2), but in another embodiment, the respective depths may be equal to each other (d1=d2) by adjusting the implanted N-type impurity ions. However, a cross-section area of the first N-type well region 310 is quite less than a cross-section area of the second N-type well region 320, which is the same when viewed in a plan view as well.

Since the entire N-type dopant concentration 300 increases as the cross-section area of the first N-type well region 310 becomes larger, the entire N-type dopant concentration may be adjusted by the cross-section area of the first N-type well region 310. However, an issue occurs in a breakdown voltage if the dopant concentration of the first N-type well region 310 exceeds a certain level; thus, a degree of dopant implantation of the first N-type well region 310 is properly adjusted to such a concentration that the reduced surface electric field (RESURF) will not collapse.

A field oxide film 120 may be formed on a surface of the substrate between a drain region 140-D and the source region 110-S. The field oxide film 120 is formed by Local Oxidation of Silicon (LOCOS) process or Shallow Trench Isolation (STI) process.

Figure 6:
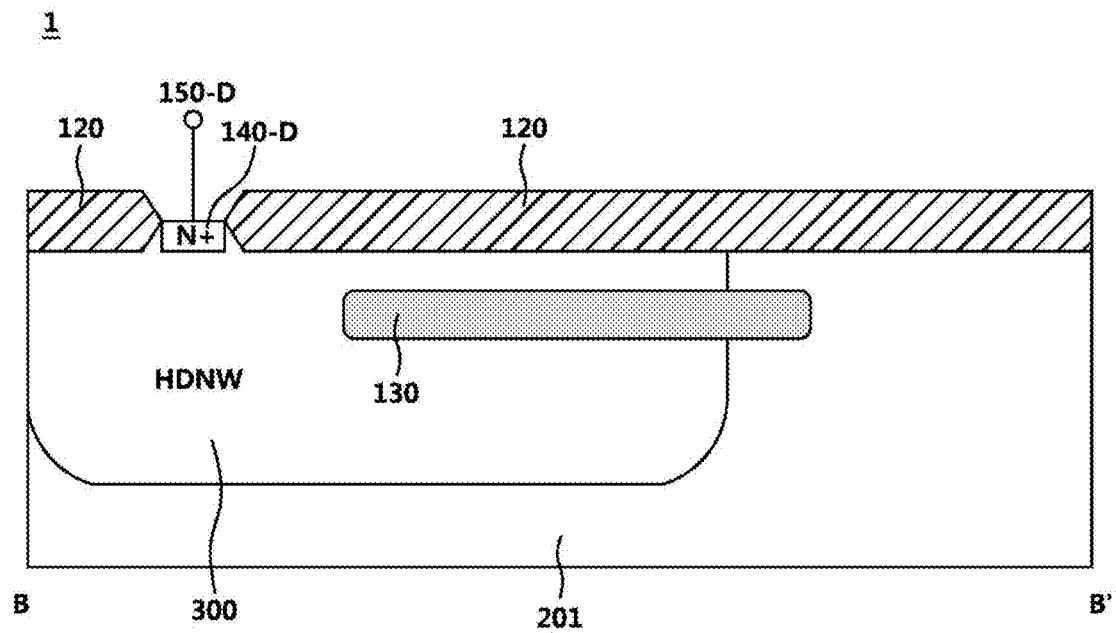
FIG. 6 are cross-sectional views of embodiments of the semiconductor device 1 of FIG. 3 along line B-B'.
Figure 6:
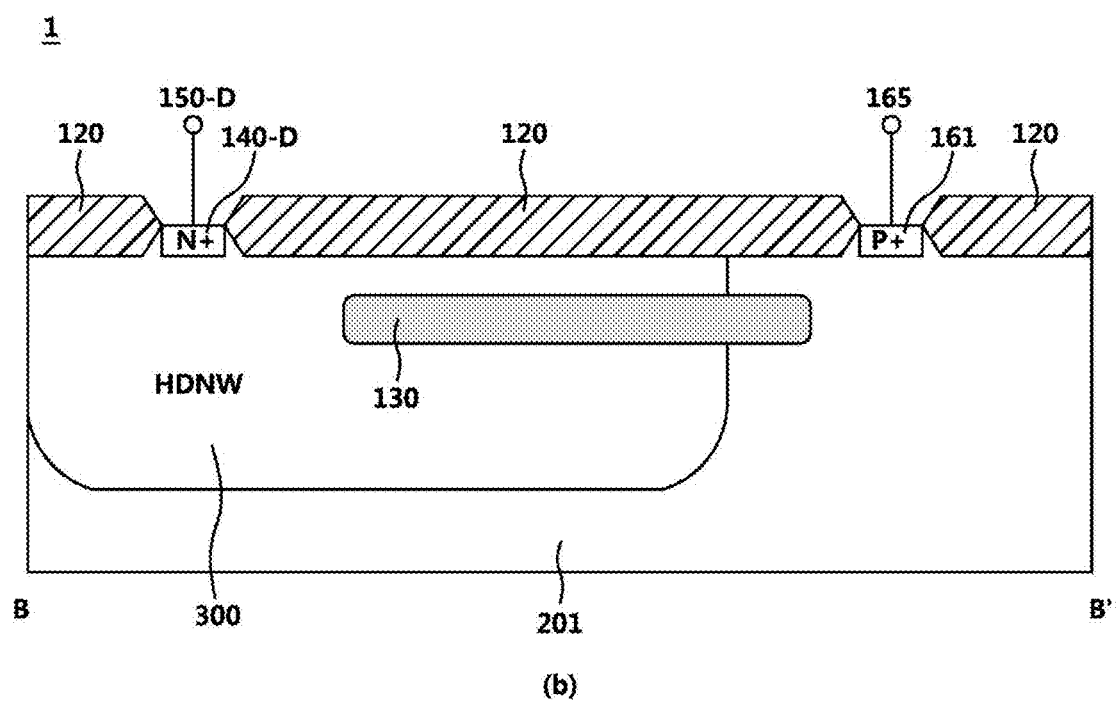

The semiconductor device 1 may further include a buried impurity layer 130, and the buried impurity layer 130 may be electrically connected to the substrate 201 (see FIG. 6). For example, the buried impurity layer 130 may be formed in the N-type well region 300 in parallel with a top surface of the substrate 201. The buried impurity layer 130 may be doped with P-type impurity ions and may be formed to cross the second N-type well region 320, the first N-type well region 310, and the diffusion region 330. The buried impurity layer 130 is spaced apart by a certain distance from and under the field oxide film 120. The buried impurity layer 130 may be formed in a horizontal direction of a bottom surface of the field oxide film 120. In another example, the buried impurity layer 130 may be formed directly below the field oxide layer without spaces. In the present description, one buried impurity layer is suggested, but in another embodiment, at least two buried impurity layers may be formed spaced apart from each other in a vertical direction with respect to a top surface of the substrate 201. Also, the breakdown voltage and the on-resistance feature of the JFET 10 may vary depending on the number of the buried impurity layers 130.

The substrate 201 is connected to a ground reference voltage. An output voltage of a source terminal 250-S of the JFET 10 is determined according to the voltage difference between the substrate 201 and the drain region 140-D.

A P-type gate region 170 of the JFET 10 is formed by implanting P-type impurity ions into the N-type well region 300. The P-type gate region 170 is formed through the P-type buried impurity layer 130 in contact with the bottom surface of the field oxide film 120. The P-type gate region 170 of the JFET 10 is electrically connected to the substrate 201 and is grounded.

A pinch-off may occur due to a potential difference between the substrate 201 and the source region 110-S. Thus, a pinch-off voltage $V_{pinch-off}$ can be adjusted by applying a certain voltage to the source region 110-S of the JFET and setting the P-type gate region 170 to a ground voltage. Because the common drain region 140-D is remote from the P-type gate region 170, the electric potential of the drain at the P-type gate region 170 becomes small. The depletion is generally caused by the source region 110-S near the P-type gate region 170, not by the potential different between the drain and the P-type gate region, thereby causing a pinch-off.

When the pinch-off occurs in the diffusion region 330, the resistance of the N-type well region 300 between the common drain terminal 150-D and the source terminal 250-S of the JFET rapidly increases. Even if the input voltage of the common drain terminal 150-D is kept increased, the output voltage of the source terminal 250-S is maintained at a certain pinch-off voltage. However, if the input voltage is below or equal to the pinch-off voltage, the output voltage of the source terminal 250-S of the JFET increases in proportion to the input voltage of the common drain terminal 150-D. That is, even when a high input voltage is input to the drain region, the JFET 10 controls the amount of voltage so that it does not exceed a specific voltage, thereby protecting an internal circuit (e.g., the control Integrated Circuit of FIG. 1) connected to the source terminal 250-S.

FIGS. 6(a) and 6(b) are cross-sectional views of an embodiment of the semiconductor device, which is a cross-sectional view taken along the line B-B' of the semiconductor device 1 of FIG. 3.

Referring to FIG. 6(a), in a semiconductor device 1 according to an embodiment, a second N-type well region 320 is disposed in a substrate 201, and a common drain region 140-D is disposed in one upper side of the well region 300. The common drain region 140-D is electrically connected to a common drain terminal 150-D, and a field oxide film 120 is formed on remaining top surface of the substrate 201 or the second N-type well region 320 except for the common drain region 140-D.

The buried impurity layer 130 may be formed in the second N-type well region 320 and P-type substrate 210, being spaced apart from a bottom surface of the field oxide film 120 by a certain distance under the field oxide film 120. In another embodiment, a buried impurity layer 130 may be formed in the second N-type well region 320, being in contact with the bottom surface of the field oxide film 120 rather than being spaced apart therefrom. In another embodiment, the buried impurity layer 130 may be a plurality of layers.

Referring to FIG. 6(b), the semiconductor device 1 according to another embodiment may further include a bulk contact region 161.

The bulk contact region 161 may be formed on a top surface of the substrate 201 in which the second N-type well region 320 is not formed. The bulk contact region 161 is electrically connected to a pick-up terminal 165. The bias to be applied to the substrate 201 varies depending on the bias applied to the pick-up terminal 165, so that the pinch-off voltage of the JFET varies depending on the voltage difference between the common drain terminal 150-D and the pick-up terminal 165.

The field oxide film 120 is formed between the drain region 140-D and the bulk contact region 161 and formed on the upper surface of the substrate 201 or the second N-type well region 320.

In addition, according to various embodiments, the semiconductor device of the present description 1 may include a P-type gate region 170 and may apply a certain voltage to an electrode (not illustrated) connected to the P-type gate region 170.

In addition, according to various embodiments, the semiconductor device 1 may include a bulk contact region 161 on the upper surface of the substrate 201 and may apply a bias to a pick-up electrode 165.

Figure 7:
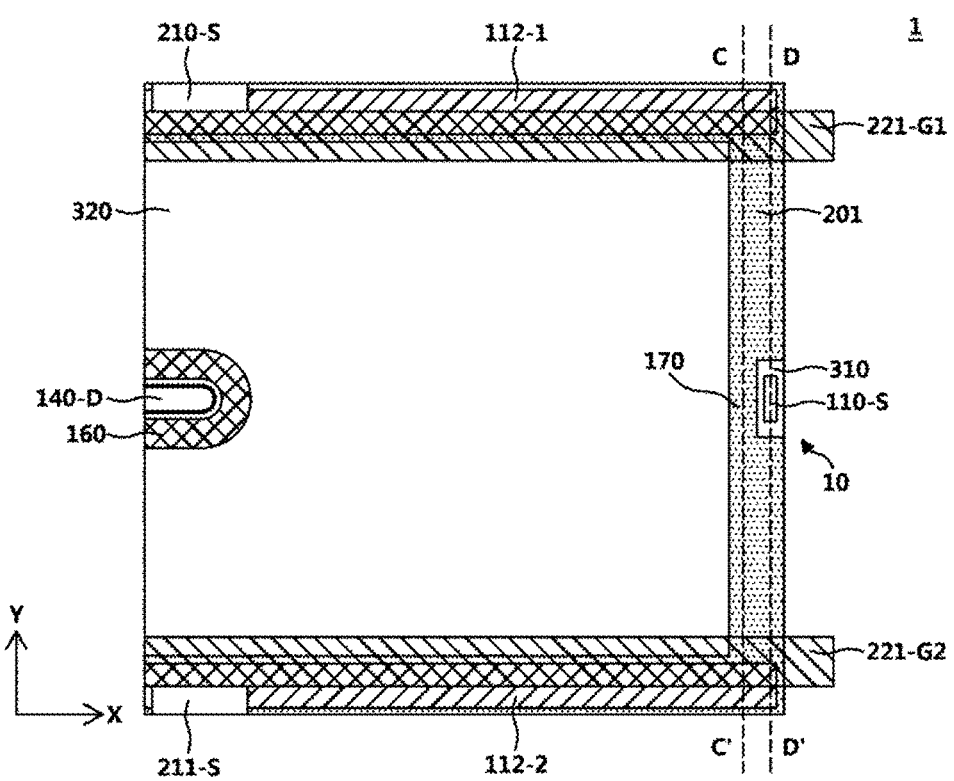
FIG. 7 is a top-view of another embodiment of a semiconductor device.

FIG. 7 is a top-view of an embodiment of a semiconductor device.

Referring to FIG. 7, it is similar to FIG. 3 but further includes gate electrodes 221-G1, 221-G2. The gate electrodes 221-G1, 221-G2 are used as a gate electrode of a HVFET 20. Each of the gate electrodes 221-G1, 221-G2 is disposed in a region in which a source region 110-S of a JFET is not disposed. Each of the gate electrodes 221-G1, 221-G2 is symmetrically disposed on both side surfaces of the substrate 201. In one example, an end of the gate electrode 221-G1, or 221-G2 may be formed extending horizontally from the first N-type well region 310. The HVFET source region 210-S, 211-S of the HVFET 20 is formed at a side surface of each gate electrode. The common drain region 140-D is disposed between the first gate electrode 221-G1 and the second gate electrode 221-G2. The source region 110-S and the first N-type well region 310 are disposed between the first gate electrode 221-G1 and the second gate electrode 221-G2. The source region 110-S of the JFET and the HVFET source region 210-S, 211-S of the HVFET 20 are formed spaced apart from each other. Each of the P-type well regions 112-1, 112-2 is formed adjacent to each of the gate electrodes 221-G1, 221-G2 of the HVFET.

Figure 8:
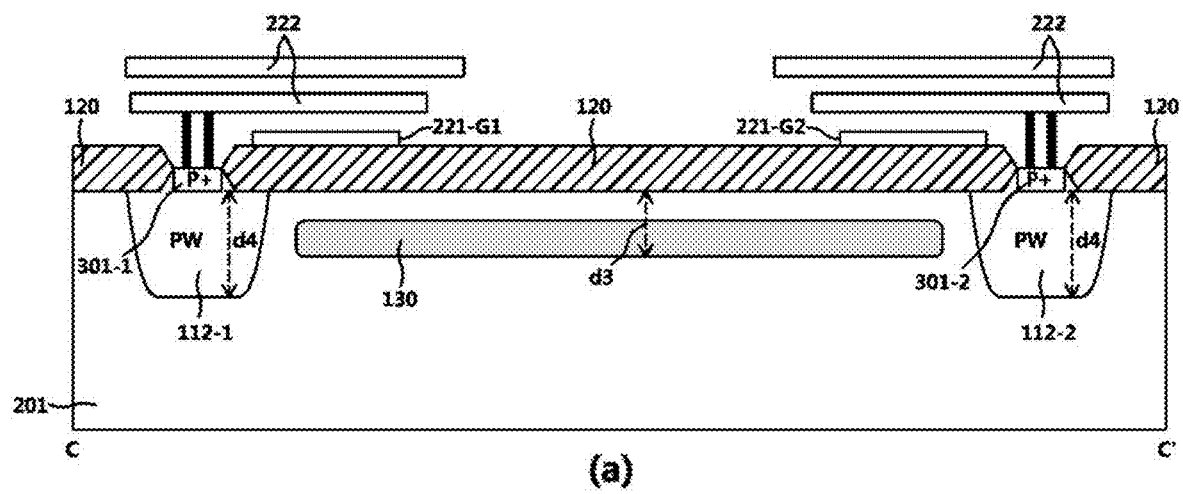
FIG. 8 are cross-sectional views of embodiments of the semiconductor device 1 of FIG. 7 along line C-C'.
Figure 8:
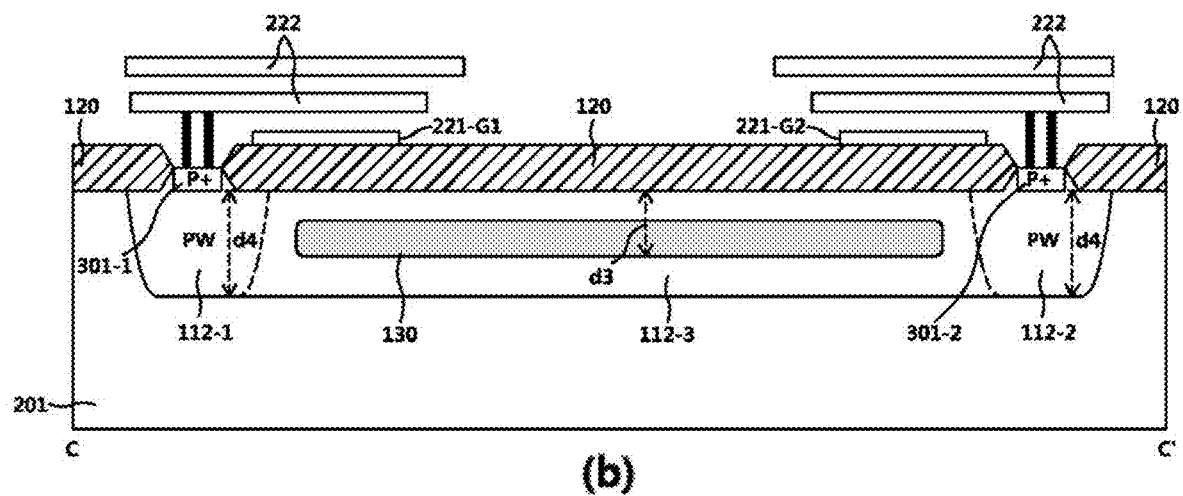

FIG. 8 is a cross-sectional view of the semiconductor device illustrated in FIG. 7, which is a cross-sectional view of the semiconductor device 1 taken along the line C-C' of FIG. 7.

In the semiconductor device 1 according to an embodiment, a field oxide film 120 is disposed on a substrate 201. Each of the gate electrodes 221-G1, 221-G2 of HVFET 20 is disposed on a top surface of the field oxide film 120. The semiconductor device 1 further includes a P-type buried impurity layer 130 disposed spaced apart from a bottom surface of the field film and having a third depth d3.

The semiconductor device 1 further includes first and second P-type well regions 112-1, 112-2. As an embodiment, referring to FIG. 8(a), each of the first and second P-type well regions 112-1, 112-2 is disposed apart from the P-type buried impurity layer 130 and has a fourth depth d4, which is a greater than the third depth d3 (d3<d4). The semiconductor device 1 further includes first and second P+ doped regions 301-1, 301-2 respectively disposed in the first and second P-type well regions.

The semiconductor 1 further includes a plurality of field plates 222 formed on the field oxide film 120. The pluralities of field plates 222 are formed spaced apart from each other, so that at least each portion of them are overlapped.

Referring to FIG. 8(b) as another embodiment, first and second P-type well regions 112-1, 112-2 may be merged as one well region, different from the embodiment of FIG. 8(a). That is, the first and second P-type well regions 112-1, 112-2 and a third P-type well region 112-3 may be formed as one P-type well region 112.

Figure 9:
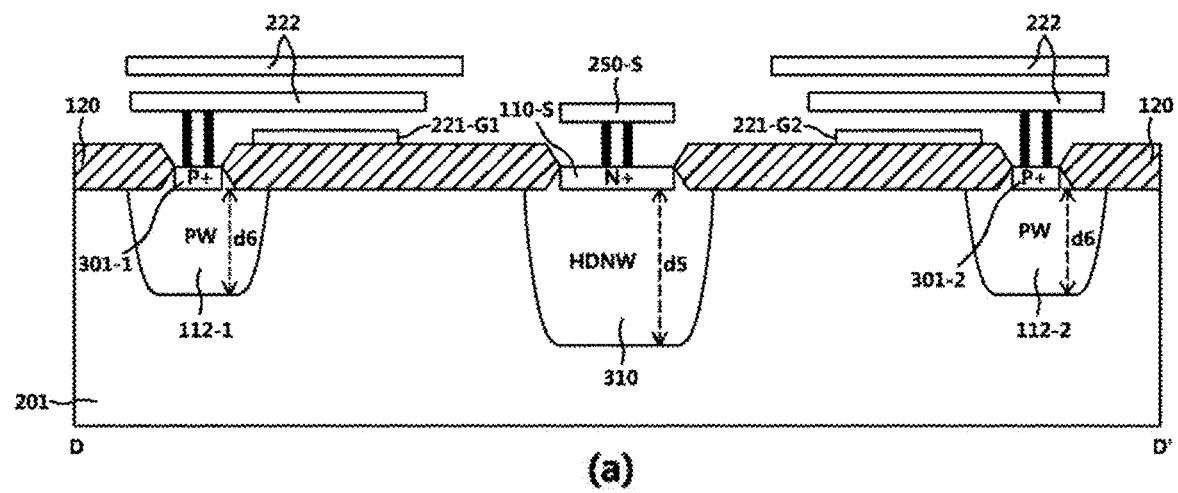
FIG. 9 are cross-sectional views of embodiments of the semiconductor device 1 of FIG. 7 along line D-D'.
Figure 9:
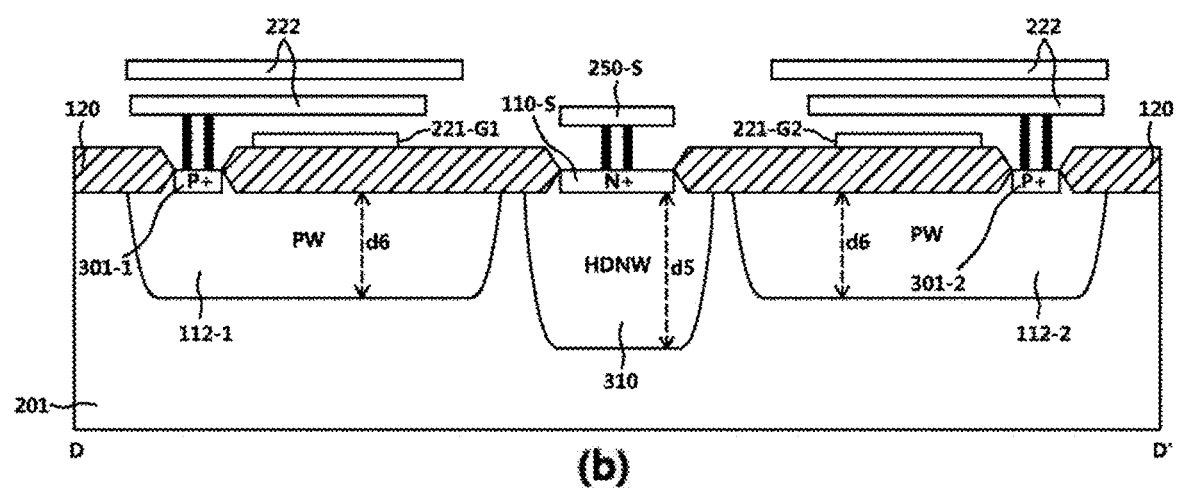

FIG. 9 is another cross-sectional view of the semiconductor device 1 illustrated in FIG. 7, taken along the line D-D'.

Referring to FIG. 9, the semiconductor device 1 includes at least a P-type well region 112-1, 112-2, the first N-type well region 310, and a field oxide film 120.

The first and second field oxide films 120 are disposed on a top surface of the substrate 201, and the first N-type well region 310 having a fifth depth d5 is disposed on the top surface of the substrate 201.

The semiconductor device 1 further includes at least one first N+ doped region 110-S (a source region of the JFET) disposed in the first N-type well region 310.

The first and second P-type well regions 112-1, 112-2 are disposed symmetrically on both sides of the first N-type well region 310 and spaced apart from the first N-type well region 310, and they have a sixth depth d6 less than the fifth depth d5.

The semiconductor device 1 further includes first and second P+ doped regions 301-1, 301-2 respectively disposed in the first and second P-type well regions 112-1, 112-2.

The semiconductor device 1 further includes first and second gate electrodes 221-G1 and 221-G2. The first and second gate electrodes 221-G1 and 221-G2 are spaced apart in a vertical direction of a plane of the substrate 201 and overlapped with the first and second P-type well regions 112-1, 112-2. The first and second gate electrodes 221-G1 and 221-G2 are disposed on the field oxide film 120.

In addition, the semiconductor device 1 further includes first and second field plates 222 formed on the first and second field oxide film 120. The first and second field plates 222 are respectively spaced apart in a vertical direction from and overlapped with the first and second gate electrodes 221-G1 and 221-G2 and the plane of the substrate.

The semiconductor device of the present description may vary the width of the first and second P-type well regions according to various embodiments. As illustrated in FIG. 9(b), the width of the first and second P-type well regions may be set as wider compared to FIG. 9(a), and thus, a breakdown voltage may be adjusted to be larger. That is, if the first and second P-type well regions 112-1, 112-2 are disposed near the first N-type well region 310, the area of a depletion region is increased much, and thus, a breakdown voltage may be increased.

Figure 10:
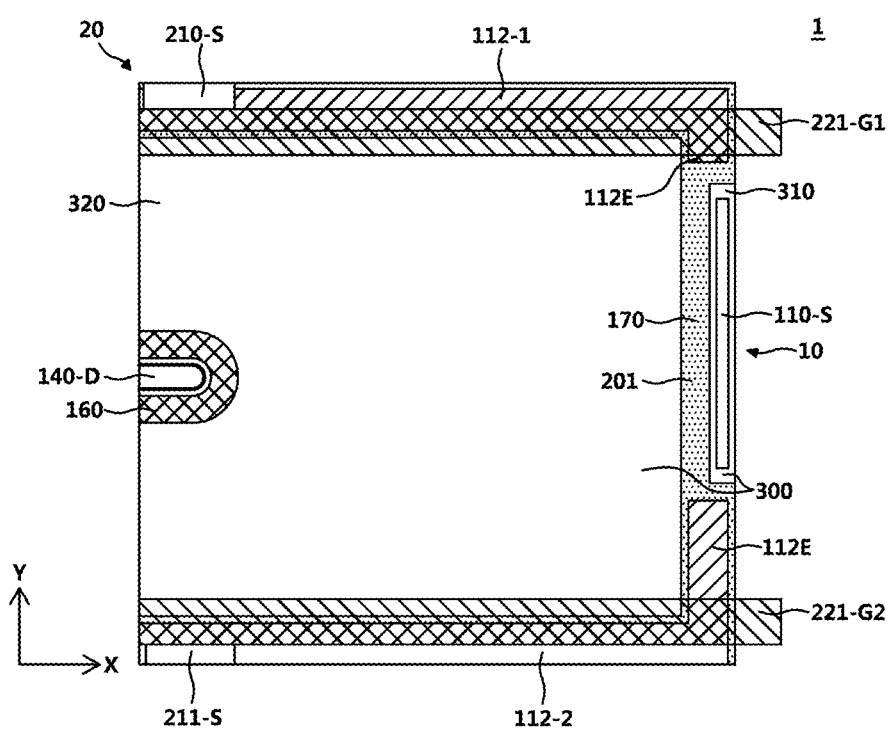
FIG. 10 is a top-view of another embodiment of a semiconductor device.

FIG. 10 is a top-view of another embodiment of a semiconductor device. For convenience of description, differences from FIG. 3 will be mainly described.

Referring to FIG. 10, a source region 110-S of the JFET may be formed in the N-type well region 310 and it is extended vertically longer on a side surface of the HVFET 20 different from FIG. 3. The first source region 110'-S1 extends from the second gate electrode 221-G2 toward the first gate electrode 221-G2 in a Y-direction, such that the first source region 110-S has a length greater than a width. The vertical length of source region 110-S as well as N-type well region 310 is increased together. If the vertical length SL1 of the source region 110-S increases, the current of the JFET increases. The source region 110-S is formed longer than that of the embodiment of FIG. 3, so the current of the JFET in FIG. 10 is higher than a JFET current in FIG. 3. The vertical length of the source region 110-S of JFET 10 is greater than a vertical length of the common drain region 140-D. The vertical length of the N-type well region 310 of JFET 10 is also greater than a vertical length of the common drain region 140-D. The length of the source region is controllable or adjustable than the drain region. The JFET current can be increased by increasing length of the source region. If the length of the source region 110-S of JFET 10 becomes longer without change in the HVFET 20, only the amount of current may be increased while a pinch-off voltage remains the same.

As shown in FIG. 10, an area of the first N-type well region 310 is increased, thus the total N-type dopants are increased. It is required to balance between the N-type dopants and P-type dopants to increase breakdown voltage of HVFET 20. Thus, the P-type well extension region 112E is extended toward to the source region of JFET 10.

Figure 11:
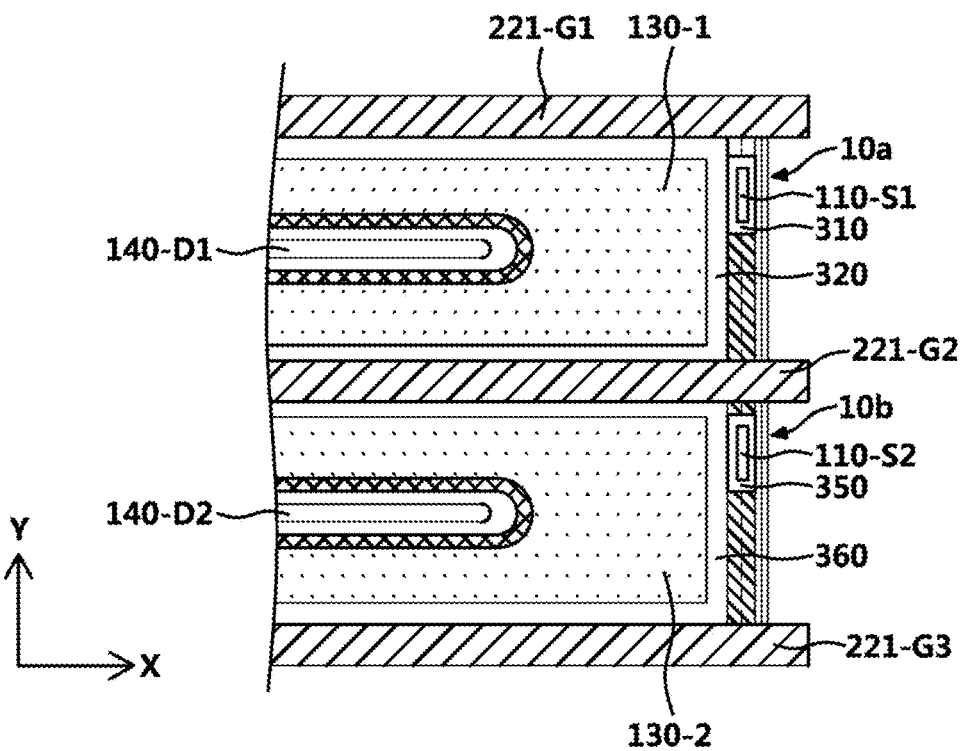
FIG. 11 is a top-view of an embodiment of a semiconductor device.

FIG. 11 is a top-view of another embodiment of a semiconductor device.

Referring to FIG. 11 as an embodiment, a first source region 110-S1, a first drain region 140-D1, a first gate electrode 221-G1, a second gate electrode 221-G2, a first buried impurity layer 130-1, a first N-type well region 310 and a second N-type well region 320 are formed in the semiconductor device 1. The first source region 110-S1 is disposed at a corner of the semiconductor device 1. The first source region 110-S1 is adjacent to the first gate electrode 221-G1 rather than the second gate electrode 221-G2.

The semiconductor device 1 further comprises a second source region 110-S2, a second drain region 140-D2, a third gate electrode 221-G3, a second buried impurity layer 130-2, a third N-type well region 350 and a fourth N-type well region 360. The second source region 110-S2 is disposed between the second gate electrode 221-G2 and the third gate electrode 221-G3. Second source region 110-S2 of JFETs 10b is formed near the second gate electrode 221-G2. Two JFETs 10a, 10b are formed in the semiconductor device 1. It helps that more JFET current flows in the semiconductor device 1.

Figure 12:
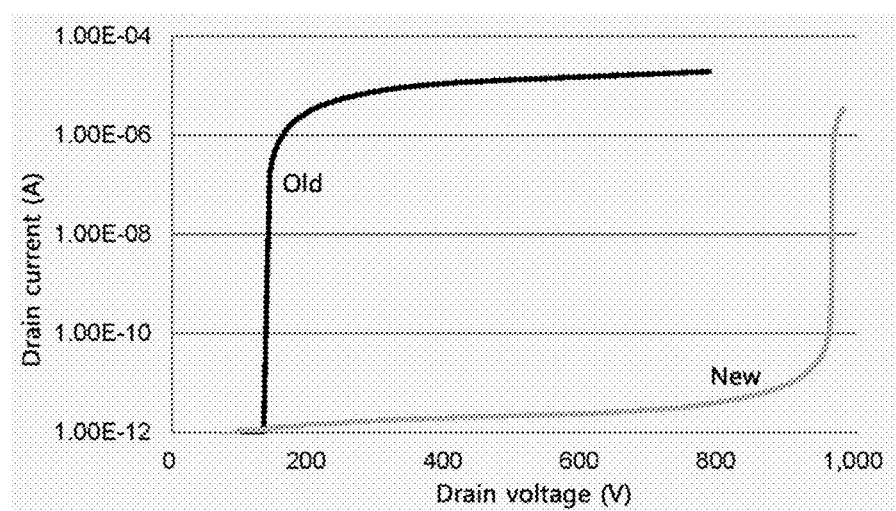
FIG. 12 is a V-I graph according to an operation of a semiconductor device according to an embodiment and a comparative example.

FIG. 12 is a V-I curve according to the operation of a semiconductor device.

When measuring voltages and currents in the semiconductor device 1' of the comparative example (that is, "Old") illustrated in FIG. 2, a well region 310 for inserting a JFET is further implanted into an outer of a HVFET. The well region 310 is extended to outside the HVFET 20, resulting in decreasing a breakdown voltage at or below 200 V.

However, in the case of the semiconductor device (that is, "New") of the present description, a breakdown voltage is near 1000 V, which is because a charge or dopant amount between an N-type impurity and a P-type impurity is balanced. In contrast, in the case of the semiconductor device ("Old"), a breakdown voltage is at or below 200 V. This indicates that it is important to design the JFET to be placed inside the HVFET 20.

Figure 13:
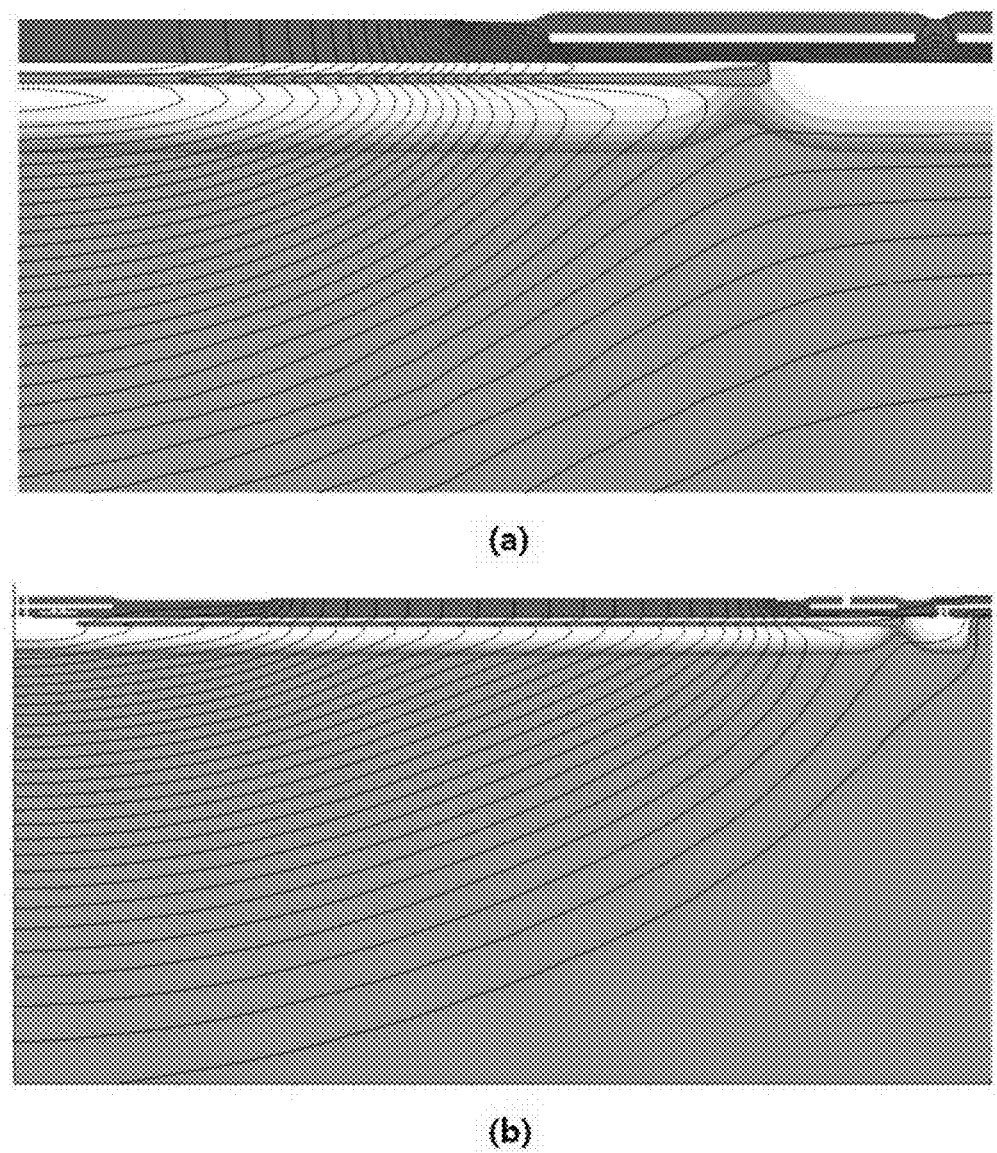
FIG. 13 are contour map of equipotential electric field line of a semiconductor device of a comparative example and an embodiment.

FIG. 13(a) is a graph of an electric field distribution according to the operation of the semiconductor device of the comparative example, and FIG. 13(b) is a graph of an electric field distribution according to the operation of the semiconductor device of the present description.

FIG. 13(a) depicts a contour map of the equipotential electric field line in the case of the comparative example. The electric field lines of the comparative example are locally concentrated at a specific point. This result is caused by the imbalance of the total N-type charge amount and the total P-type charge amount in the HVFET 20. When the N-type well region 310 including the source region of the JFET is formed outside the HVFET 20, the RESURF of the HVFET collapses. Thus, the breakdown voltage is lowered to 200 V or less as illustrated in FIG. 12.

However, in the case of the semiconductor device of the present description (that is, New), the electric field is uniformly distributed as illustrated in FIG. 13(b); as a result, the breakdown voltage is near 1000 V. This shows that it is important to design the source region 110-S and the first N-type well region 310 of JFET 10 to be arranged within an area or boundary of the HVFET 20.

A semiconductor device according to the present description allows the JFET and the HVFET to share a drain, thereby improving the integration degree.

In addition, a semiconductor device according to the present description allows the JFET to be fully inserted into the HVFET, thereby having advantages in design.

In addition, a semiconductor device according to the present description forms a P-type well region of the JFET in an N-type well region in a channel region of the HVFET in a direction toward the channel width, thereby individually controlling the pinch-off feature of the JFET while maintaining an electric feature of the HVFET.

In addition, a semiconductor device according to the present description reduces the area of a well region for a source region of the JFET, thereby having an effect that RESURF does not collapse.

In addition, a semiconductor device according to the present description reduces the area of a well region of the JFET, and thus, the electric field is uniformly distributed, thereby having a higher breakdown voltage.

In addition, a semiconductor device according to the present description operates at a relatively high voltage, thereby having an effect that the JFET may be used at the same voltage region together with the HVFET.

In addition, a semiconductor device according to the present description individually controls the area of a source region of the JFET, thereby individually controlling the current amount without any change in pinch-off.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a first junction field effect transistor (JFET) comprising:
      a first N-type well region disposed in a substrate;
      a second N-type well region abutting the first N-type well region;
      a first JFET source region disposed in the first N-type well region;
      a common drain region disposed in the second N-type well region; and
   a first high voltage field effect transistor (HVFET) comprising:
      a first P-type well region formed in the substrate;
      a first HVFET source region disposed in the first P-type well region;
      the common drain region disposed in the second N-type well region and shared by the first JFET and the first HVFET; and
      a first gate electrode formed on the first P-type well region and disposed between the first HVFET source and the common drain region.

2. The semiconductor device of claim 1, wherein a maximum vertical length of the first JFET source region is greater than a maximum vertical length of the common drain region.

3. The semiconductor device of claim 1, wherein the first JFET has a rectangular shape in a plan view.

4. The semiconductor device of claim 3, wherein the rectangular shape has a vertical length greater than a horizontal length.

5. The semiconductor device of claim 1, wherein the first N-type well region has a cross-sectional area smaller than a cross-sectional area of the second N-type well region.

6. The semiconductor device of claim 1, wherein the first N-type well region has a maximum depth smaller than or equal to a maximum depth of the second N-type well region with respect to a top surface of the substrate respectively.

7. The semiconductor device of claim 1, further comprising a P-type gate region disposed between the first N-type well region and the second N-type well region.

8. The semiconductor device of claim 1, further comprising a second HVFET comprising:
   a second P-type well region formed in the substrate;
   a second HVFET source region disposed in the second P-type well region;
   the common drain region disposed in the second N-type well region; and
   a second gate electrode disposed between the second HVFET source region and the common drain region,
   wherein the common drain region is shared by the first HVFET and the second HVFET.

9. The semiconductor device of claim 1, further comprising a second JFET comprising:
   a third N-type well region spaced apart from the first N-type well region;
   a fourth N-type well region spaced apart from the second N-type well region;
   a second JFET source region disposed in the third N-type well region; and
   a second common drain region disposed in the fourth N-type well region.

10. The semiconductor device of claim 8, wherein the first JFET source region does not protrude outwardly from a virtual line connected between an end of the first gate electrode and an end of the second gate electrode.

11. The semiconductor device of claim 1, wherein the first JFET source region has a length in a vertical direction perpendicular to the first gate electrode having a length in a horizontal direction in a plan view.

12. A semiconductor device comprising:
    a junction field effect transistor (JFET) comprising:
       an N-type well region disposed in a substrate;
       a first JFET source region disposed in the N-type well region; and
       a common drain region disposed in the N-type well region; and
    a first high voltage field effect transistor (HVFET) comprising:
       a first P-type well region spaced apart from the N-type well region;
       a first field oxide film formed over the first P-type well region;
       a first gate electrode formed over the first field oxide film; and a first field plate formed over the first field oxide film to overlap the first gate electrode, wherein the common drain region is shared by the JFET and the first HVFET.

13. The semiconductor device of claim 12, wherein the N-type well region comprises:

a first well region; and a second well region abutting the first well region, and wherein the first JFET source region and the common drain region are formed in the first well region and the second well region, respectively.

14. The semiconductor device of claim 12, wherein the N-type well region has a maximum depth larger than that of the first P-type well region with respect to a top surface of the substrate.

15. The semiconductor device of claim 14, further comprising a P-type buried layer spaced apart from a bottom surface of the first field oxide film.

16. The semiconductor device of claim 12, further comprising a second HVFET comprising:

a second P-type well region spaced apart from the N-type well region;

a second field oxide film formed over the second P-type well region;

a second gate electrode formed over the second field oxide film; and a second field plate formed over the second field oxide film to overlap the second gate electrode, wherein the common drain region is shared by the first HVFET and the second HVFET.

17. The semiconductor device of claim 16, wherein the first and second HVFETs further comprise a first HVFET source region and a second HVFET source region, respectively.

18. The semiconductor device of claim 16, wherein the first JFET source region does not protrude outwardly from a virtual line connected between an end of the first gate electrode and an end of the second gate electrode.

19. The semiconductor device of claim 12, wherein the first JFET source region has a length in a vertical direction perpendicular to the first gate electrode having a length in a horizontal direction in a plan view.

20. The semiconductor device of claim 12, wherein the JFET further comprises a P-type gate region formed in the N-type well region.

* * * * *